United States Patent
Nguyen et al.

(10) Patent No.: US 8,338,712 B2
(45) Date of Patent: *Dec. 25, 2012

(54) MULTILAYER CIRCUIT DEVICE HAVING ELECTRICALLY ISOLATED TIGHTLY SPACED ELECTRICAL CURRENT CARRYING TRACES

(76) Inventors: Vinh T. Nguyen, San Jose, CA (US); Claude A. S. Hamrick, Lincoln, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/969,478

(22) Filed: Dec. 15, 2010

(65) Prior Publication Data

US 2011/0083881 A1    Apr. 14, 2011

Related U.S. Application Data

(63) Continuation-in-part of application No. 12/263,416, filed on Oct. 31, 2008, now Pat. No. 7,874,065.

(60) Provisional application No. 61/001,156, filed on Oct. 31, 2007, provisional application No. 60/989,361, filed on Nov. 20, 2007.

(51) Int. Cl.
 *H05K 1/00* (2006.01)
(52) U.S. Cl. ........................ 174/250
(58) Field of Classification Search ............ 174/250
 See application file for complete search history.

(56) References Cited

U.S. PATENT DOCUMENTS

| | | | |
|---|---|---|---|
| 3,747,486 A * | 7/1973 | Herrmann et al. | 396/548 |
| 4,915,983 A * | 4/1990 | Lake et al. | 430/314 |
| 5,440,805 A * | 8/1995 | Daigle et al. | 29/830 |
| 6,162,365 A * | 12/2000 | Bhatt et al. | 216/13 |
| 6,570,258 B2 * | 5/2003 | Ma et al. | 257/774 |
| 6,709,562 B1 * | 3/2004 | Andricacos et al. | 205/122 |
| 6,801,096 B1 * | 10/2004 | Nariman et al. | 331/57 |
| 6,822,334 B2 * | 11/2004 | Hori et al. | 257/775 |
| 6,891,261 B2 * | 5/2005 | Awaya | 257/692 |
| 6,913,952 B2 * | 7/2005 | Moxham et al. | 438/125 |
| 6,946,716 B2 * | 9/2005 | Andricacos et al. | 257/508 |
| 7,365,006 B1 * | 4/2008 | Huemoeller et al. | 438/637 |
| 7,874,065 B2 * | 1/2011 | Nguyen et al. | 29/830 |
| 2006/0157854 A1 * | 7/2006 | Takewaki et al. | 257/758 |
| 2006/0197228 A1 * | 9/2006 | Daubenspeck et al. | 257/773 |
| 2007/0114203 A1 * | 5/2007 | Kang | 216/13 |

* cited by examiner

*Primary Examiner* — Timothy Thompson
*Assistant Examiner* — Nathan Milakovich
(74) *Attorney, Agent, or Firm* — IXPLAW Group LLP; Claude A. S. Hamrick

(57) ABSTRACT

A multilayer circuit device having electrically isolated tightly spaced electrical current carrying traces and including a first nonconductive substrate having a first conductive material affixed to a first side thereof to form a first ground plane, a plurality of elongated first conductive traces formed on a second side of the first non-conductive substrate and having transverse widths of 50 microns or less and rising above the upper surface of the first substrate to a height equal to or greater than the widths thereof such that a transverse cross section of the first conductive traces has a height-to-width ratio equal to or exceeding 1, adjacent ones of the first traces being separated from each other by first elongated spaces, the first conductive traces being variously useful as ground lines, signal lines and/or power lines.

20 Claims, 10 Drawing Sheets

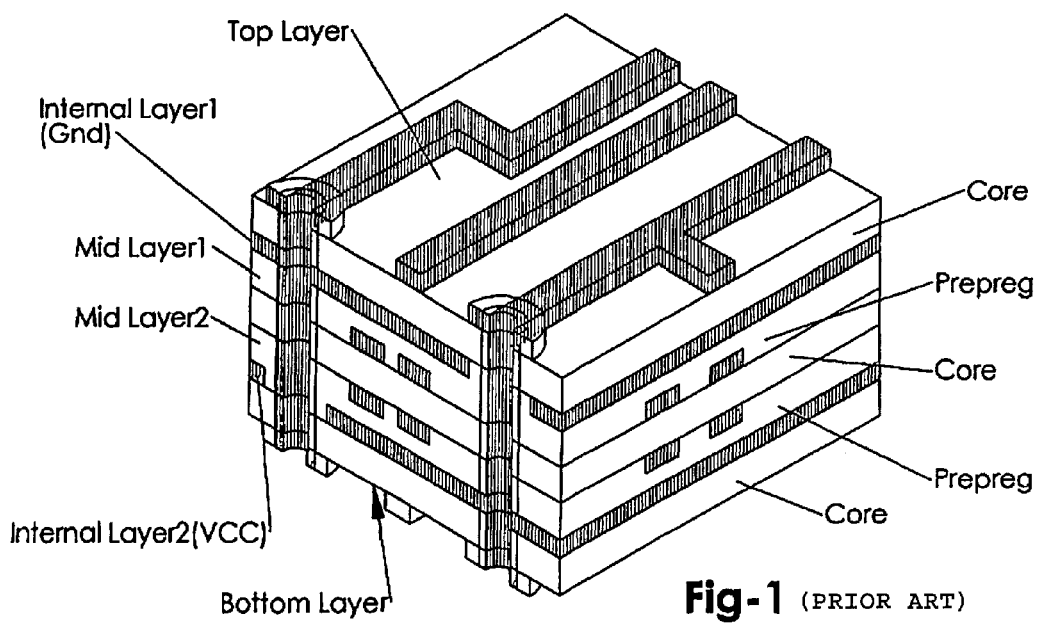
Fig-1 (PRIOR ART)
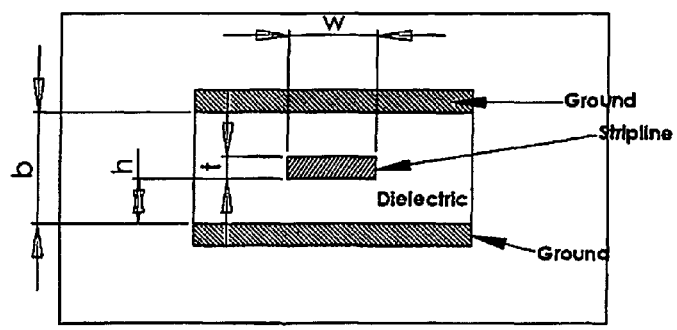
Fig-2 (PRIOR ART)
$$Z_0 = \frac{60}{\sqrt{E_r}} \ln\left[\frac{4H}{0.67\pi W(0.8 + t/D)}\right]$$
Fig-3

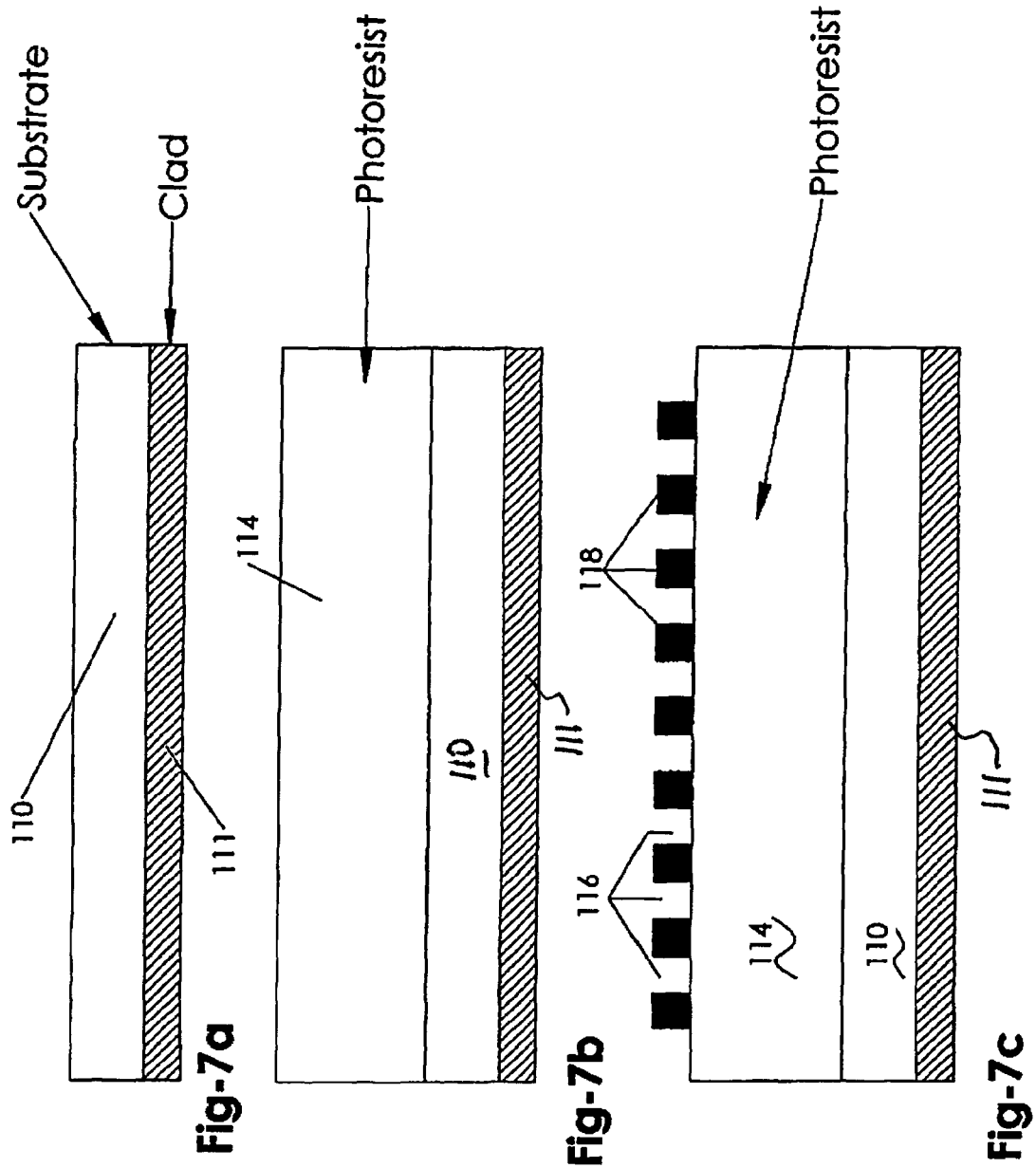

MULTILAYER CIRCUIT DEVICE HAVING ELECTRICALLY ISOLATED TIGHTLY SPACED ELECTRICAL CURRENT CARRYING TRACES

RELATED APPLICATIONS

This application is a Continuation-in-Part of U.S. patent application Ser. No. 12/263,416 filed on Oct. 31, 2008 (now U.S. Pat. No. 7,874,065 issued Jan. 25, 2011), which is incorporated herein by reference and to which priority is claimed, and is related to, and incorporates by reference in their entirety, the invention disclosures of U.S. patent application Ser. No. 11/890,222 (now U.S. Pat. No. 7,629,804 issued Dec. 8, 2009), and U.S. Provisional Applications Ser. No. 61/001,156 filed on Oct. 31, 2007, and Ser. No. 60/989,361 filed Nov. 20, 2007. Applicants additionally claim priority to U.S. Provisional Applications Ser. Nos. 61/001,156 filed on Oct. 31, 2007 and Ser. No. 60/989,361 filed Nov. 20, 2007.

FIELD OF THE INVENTION

The present invention relates generally to multilayer circuit apparatus and more particularly to a device and process for making a multi-layered circuit board having closely spaced circuit traces, and one particularly suited for use as a multi-circuit interface/connector device or a probe card transformer of the type used to link an IC test system to probe pins or contactors used to engage the die pads or solder bumps or the like of IC devices before they are separated from the wafer upon which they are formed.

BACKGROUND OF THE INVENTION

A probe card assembly typically includes a contactor substrate carrying a large number of die pad contacting pins, a space transformer for connecting the closely positioned pins to a set of terminals positioned outwardly from the pin positions, and an interface board that serves as a means for connecting the hundreds or thousands of connector terminals to corresponding power, ground and signal terminals of an Automatic Test Equipment (ATE).

The space transformer and the interface board are typically fabricated using well known printed circuit board (PCB) processes and materials. Such components are usually made by adhering a layer of copper over a substrate, sometimes on both sides, then removing unwanted copper (e.g., by etching) after applying a temporary mask, leaving only the desired copper traces. A plurality of such boards are then laminated together and the traces formed thereon are interconnected to provide a means for connecting power and signals to a plurality of micro-miniature electronic devices. Some of these PCB assemblies are made by adding traces to a bare substrate (or a substrate with a very thin layer of copper) usually by a complex process of multiple electroplating steps or by using inkjet printing techniques.

Another application of multilayer circuit boards of the type to be described herein is to provide an improved package interface or external interface device that can be used to improve, augment or even replace the Ball Grid Array (BGA) which has heretofore provided a solution to the problem of packaging and interconnecting an integrated circuit with many hundreds of pins. As pin grid arrays and dual-in-line surface mount (SOIC) packages are produced with more and more pins, and with decreasing spacing between the pins, interfacing difficulties arise in connecting the integrated circuits to systems using the circuit device. For example, as even modern package pins get closer together, the danger of accidentally bridging adjacent pins with solder increases. BGAs have provided an element of solution to the problem in that they enable the solder to be factory-applied to the package in exactly the right amount. Moreover, the shorter an electrical conductor between IC device and the system to which it is connected, the lower its inductance, a property which causes unwanted distortion of signals in high-speed electronic circuits. BGAs, with their very short distance between the package and the PCB, have low inductances and therefore have far superior electrical performance to leaded devices. However, as IC devices continue to include more and more I/Os it is not always convenient to use the standard I/O locations of even BGA packages for connecting an electronic device to a system using the device. There is thus a need for an improved circuit board type of interface means for allowing freedom from connection constraints when high pin-out devices are to be connected to a user system.

There are basically three common "subtractive" methods (methods that remove copper) used in the production of printed circuit boards:

1) Silk screen printing, which uses etch-resistant inks to protect the copper foil, with subsequent etching used to remove the unwanted copper. Alternatively, the ink may be conductive and printed on a blank (non-conductive) board;

2) Photoengraving, which uses a photomask and chemical etching to remove the copper foil from the substrate. The photomask is usually prepared with a photoplotter from data produced by a technician using CAM (computer-aided manufacturing) software. Laser-printed transparencies are typically employed for phototools; however, direct laser imaging techniques are being employed to replace phototools for high-resolution requirements. However, state of the art laser technology can not be utilized to produce trace spacings of less than about 25 microns; and 3) PCB milling, which uses a two or three-axis mechanical milling system to mill away the copper foil from the substrate.

"Additive" processes may also be used. The most common is the "semi-additive" process in which an un-patterned board is provided with a thin layer of copper on its surface. A reverse mask is then applied that, unlike a subtractive process mask, exposes those parts of the substrate that will eventually become the traces. Additional copper is then plated onto the board in the unmasked areas. Tin-lead or other surface platings are then applied. The mask is stripped away and a brief etching step removes the now-exposed original copper laminate from the board, isolating the individual traces. The additive process is commonly used for multi-layer boards as it facilitates the plating-through of the holes (vias) in the circuit board. However, a problem with use of this method for small trace geometries is that the etching step undercuts the edges of the traces yielding undesirable results.

As circuit device geometries have continued to shrink and the number of circuit devices on each die has increased, the number of contact pads per die has also dramatically increased. This, coupled with a decrease in die size, has dramatically increased the pad density of IC devices produced on a processed wafer. Furthermore, with increases in wafer size and decreases in die size and contact pad pitch, the number of dies as well as the number of contact pads on a wafer has likewise increased.

Moreover, since production efficiencies require that all die now be tested at the wafer level, it is no longer feasible to test each die individually, and accordingly, it is important that many die be simultaneously tested. This of course means that thousands of electrically conductive lines must be routed between the probe pins used to contact the die pads (or solder bumps or the like) and a test equipment. In order to accomplish this task by making electrical contact with the die pads, it is necessary to provide thousands of conductive traces on or in the various devices used to link the contacting pins to the ATE. Thus, multilayer PCBs are used to provide the large number of circuit traces in the space available. Compactness of the traces also requires that the trace width and thickness be reduced, as well as the spacing between traces. A typical prior art multi-layer circuit board is shown in FIG. 1.

However, since signals carried by the signal traces are often at very high frequencies, the traces must be electrically isolated from each other in order to avoid cross talk between the traces and to control the impedance of the traces. Stripline technology is commonly used in making multilayer circuit boards.

A stripline is a conductor sandwiched by dielectric between a pair of groundplanes. In practice, a stripline is usually made by etching circuitry from a thin film deposited on one surface of a substrate that has a ground plane formed on the opposite face, then adding a second substrate (which is metalized on only one surface) on top to achieve the second ground plane. Stripline is most often a "soft-board" technology, but using low-temperature co-fired ceramics (LTCC), ceramic stripline circuits are also possible.

All kinds of circuits can be fabricated if a third layer of dielectric is added along with a second interior metal layer, for example, a stack-up of 31 mil Duroid, then 5 mil Duroid, then 31 mil Duroid (Duroid is a trademark of the Rogers Corporation). Transmission lines on either of the interior metal layers behave very nearly like "classic" stripline, the slight asymmetry is not a problem. For example, excellent "broadside" couplers can be made by running transmission lines parallel to each other on the two surfaces. Other variants of the stripline are offset strip line and suspended air stripline (SAS).

For stripline and offset stripline, because all of the fields are constrained to the same dielectric, the effective dielectric constant is equal to the relative dielectric constant of the chosen dielectric material.

Stripline is a TEM (transverse electromagnetic) transmission line media, like coax. This means that it is non-dispersive, and has no cutoff frequency. Stripline filters and couplers always offer better bandwidth than their counterparts in microstrip.

Another advantage of stripline is that excellent isolation between adjacent traces can be achieved (as opposed to microstrip). Very good isolation results when a picket-fence of vias surrounds each transmission line, spaced at less than ¼ wavelength. Stripline can also be used to route RF signals across each other quite easily when offset stripline is used.

Disadvantages of stripline are two: first, it is much harder (and more expensive) to fabricate than microstrip. Lumped-element and active components either have to be buried between the groundplanes (generally a tricky proposition), or transitions to microstrip must be employed as needed to make connections on the top of the board.

A second disadvantage of stripline is that because of the second groundplane, the strip widths are much narrower for a given impedance (such as 50 ohms) and board thickness than for microstrip. This disadvantage is however a benefit as will be described below in the description of the present invention.

A simplified equation for the line impedance of a stripline is given as:

$$Z_0 = \frac{60}{\sqrt{\varepsilon_r}} \ln\left[\frac{4H}{0.67\pi W\left(0.8 + \frac{t}{D}\right)}\right]$$

where the variables are illustrated in FIG. 2 of the drawing.

With these prior art conditions and considerations in mind, it would appear that making devices of the type described with smaller and smaller trace widths and spacings could be accommodated using modern photolithographic processes. However, as suggested by the above equation, for a particular conductor thickness, a decrease in conductor width will result in a proportional increase in conductor impedance. It will thus be appreciated that as trace width reductions are required to allow for increased trace density, a practical limit will be reached based on the material thickness that is to be used in the trace forming process. Although photo-lithographic technology can be used to make very closely spaced thin metal traces having very narrow transverse widths, the use of etching processes on relatively thick conductive layers results in trace undercutting which not only reduces the effective width of the trace but increases the separation between adjacent traces. There is thus a need for a different approach to trace formation; i.e., one that allows the formation of traces in which the transverse height-to-width ratio of the trace cross section is equal to or greater than 1.

It is thus an objective of the present invention to provide a novel multilayer printed circuit board device and method of producing same wherein current carrying traces having optimized cross sectional area enable extremely close arrays of narrow traces to be utilized in applications requiring particular impedance characteristics.

Another objective of the present invention is to provide a circuit board having extremely narrow traces that are closely spaced apart but have large enough cross sectional area to handle a required level of electrical current.

Still another objective of the present invention is to provide a novel process for making circuit board devices with conductive traces having a height-to-width ratio of 1 or greater thus enabling the use of stripline concepts in circuit devices of the types wherein very closely spaced extremely narrow conductive traces are required.

IN THE DRAWING

FIG. 1 is an illustration of a prior art multilayer printed circuit board;

FIG. 2 is a diagram schematically illustrating a cross section of a typical stripline;

FIG. 3 is a simplified stripline equation relating to the diagram of FIG. 2;

FIGS. 7a-7f illustrate an alternative embodiment of a process for making a circuit board device having extremely narrow circuit traces with extremely narrow spacings there-between in accordance with the present invention;

DETAILED DESCRIPTION OF EMBODIMENTS

Figure 4A:
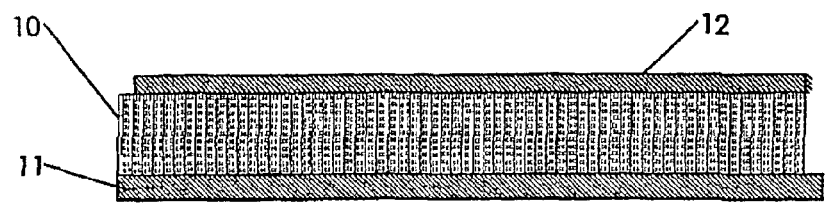
FIGS. 4a-4f are cross sectional views generally illustrating a process for making circuit board devices having extremely narrow parallel circuit traces with extremely narrow spacings there-between in accordance with one embodiment of the present invention.

Referring now to FIG. 4a, a planar substrate is shown generally at 10 having a particular dielectric constant suitable for the application described. Board 10 may be of a ceramic material, a woven epoxy glass material known as FR4, or any other suitable substrate material. The substrate board may have a metal layer of a material such as copper plated on its bottom surface as indicated at 11

In accordance with a first embodiment of the present invention wherein circuit traces are to be provided by electroplating, a first step is to lay down a thin metallic seed layer 12 of a suitable material, such as copper or silver for example, on the upper surface of the substrate by printing, spraying, using an electro-less process, etc. The seed layer 12 is a very thin plating of about 1 micron thickness with high conductive quality and good adherence to the substrate 10. This layer will serve as a foundation for the subsequent plating process.

Figure 4B:
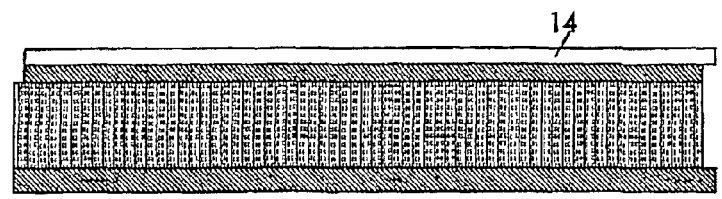
Figure 4C:
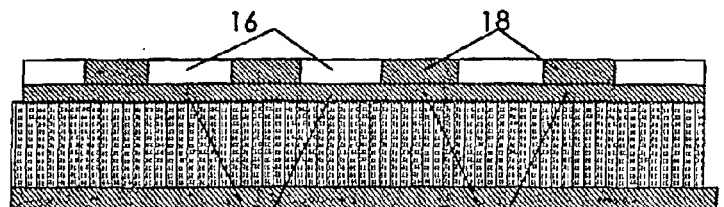

The next step, as illustrated in FIG. 4b, is to cover the surface of the seed layer 12 with a layer 14 of photoresist, and to use well known mask and exposure techniques to delineate, as suggested in FIG. 4c, a circuit trace pattern in the resist having spacings 16 between the defined areas 18 in which conductive seed traces 17b (shown in transverse cross-section) will be formed. In accordance with the present invention, the trace spacings 16 can be on the order of 25 microns or less in width and the trace widths can likewise be on the order of 25 microns or less. The pattern is then developed by application of a stripper to remove the resist in the areas 16 and to uncover the seed layer material 17a lying there-beneath.

Figure 4D:
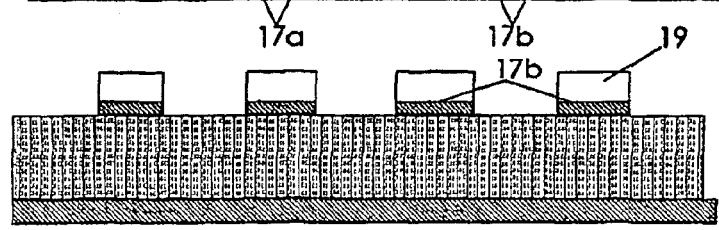

An etching operation is then used to remove the exposed areas 17a of the seed layer leaving only the seed traces 17b as depicted in FIG. 4d.

Figure 4E:
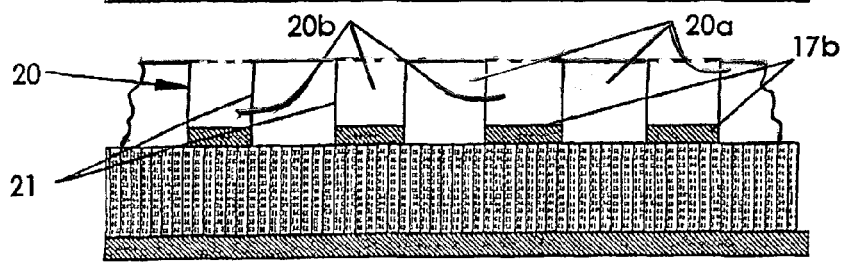

The next step is to strip the resist 19 from the top surfaces of the seed layer traces 17b, and to again use a photolithographic process and an opposite type of photoresist to develop a thick layer (preferably between about 50 and 200 microns or more in thickness) of photoresist 20 over the board surface which can then be subjected to a photolithographic process to uncover the seed traces 17b but leave relatively high (approximately 50-200 microns or more in height) ribs of resist 20a forming open channels or valleys 20b lying directly above the seed traces 17b, the valleys being defined by the vertical, well defined rib walls 21. The relatively high ribs 20 thus rise above the edge boundaries of the seed layer traces 17b as shown in FIG. 4e. In accordance with this embodiment, the height of the ribs 20a may be at least as great as the width of the seed trace 17b but may be substantially greater.

Figure 4F:
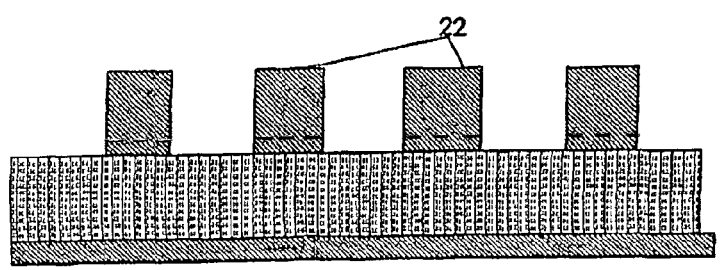

A predetermined thickness of conductive metal can then be electroplated to a predetermined height onto the seed layer traces 17b between the photoresist ribs or barriers 20a, and a suitable stripper can subsequently be used to strip away the ribs 20a to leave well defined conductive traces 22 as depicted in FIG. 4f. Note that because etching is not required to remove metallic material between the traces, well defined trace cross sectional geometries with height-to-width (H/W) aspect ratios equal to or greater than 1 can be achieved.

It will thus be appreciated that in using the method described above and illustrated in FIGS. 4a-4f, conductive traces having widths on the order of 25 microns or less with a predetermined cross-sectional area, and separated by spaces on the order of 25 microns or less can be provided. Note that the cross-sectional area of the traces can be of almost any desired width and height required to accommodate a particular level of current flow or impedance.

Currently, a desirable trace spacing is less than 20 microns. However, for a variety of reasons, no prior art process is capable at this time of producing well defined circuit traces having trace widths of 25 microns or less separated by less than about 25 microns and capable of handling sufficient electrical current to be useful in multilayer circuit card assemblies such as the transformer devices used in probe card systems.

Figure 5:
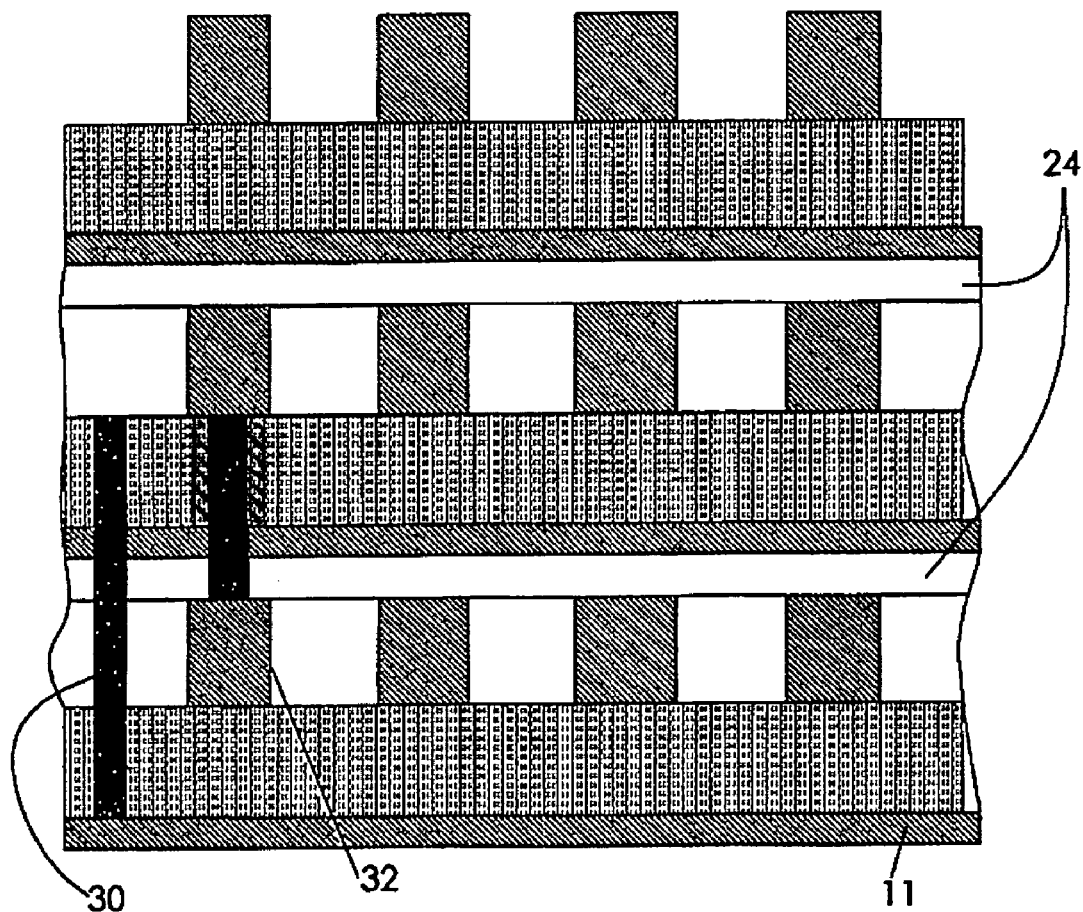
FIG. 5 is a simplified cross sectional view generally illustrating an embodiment of a multilayered circuit board device made in accordance with the present invention.

Once several boards are produced, they can be drilled to accommodate interconnections through vias (as shown at 30 and 32 in FIG. 5), and be stacked and joined together by layers 24 of insulative bonding material such as Prepreg, Bondply, or the like. In some cases two or more of the boards may be joined together and then drilled to provide for connecting vias.

Figure 6:
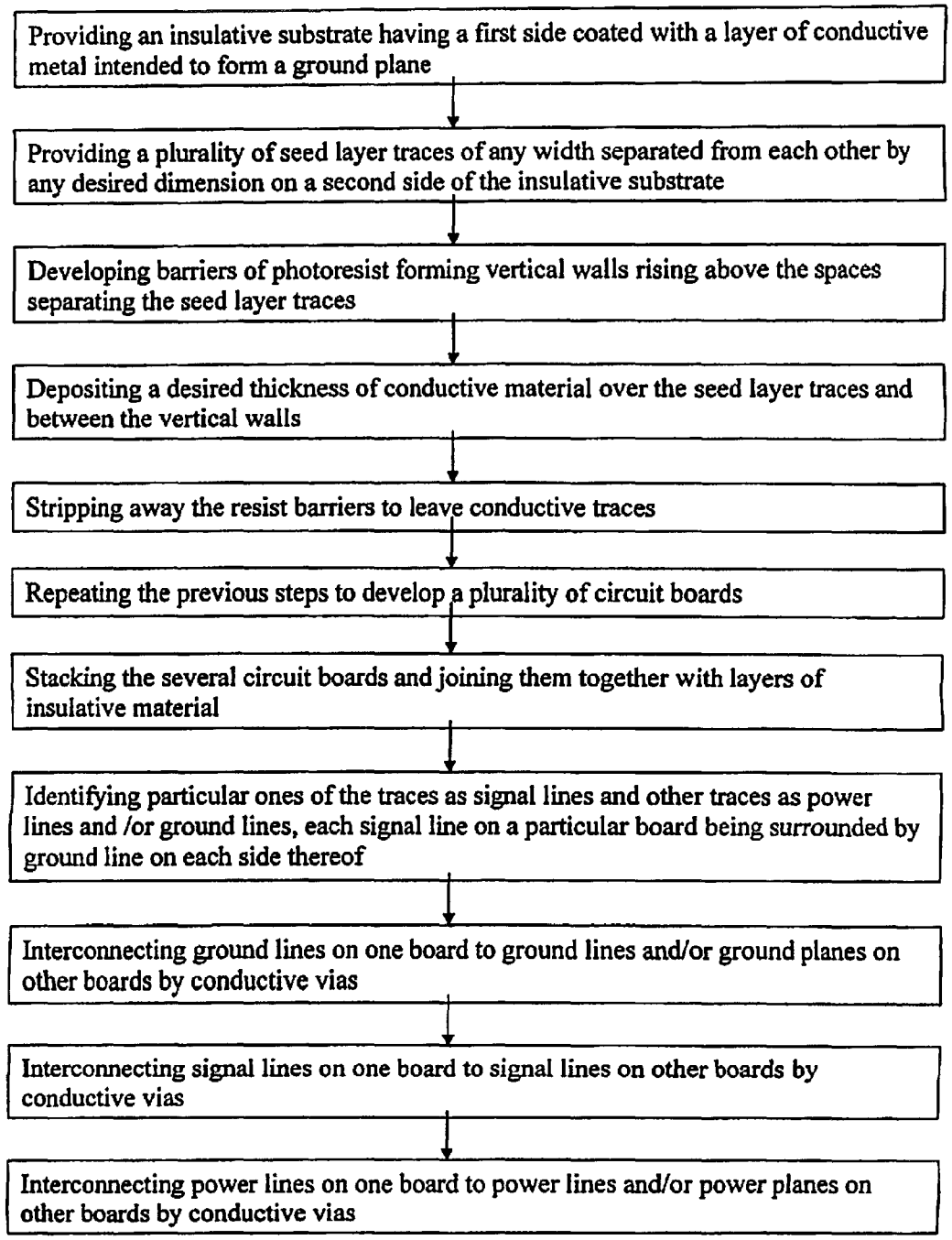
FIG. 6 is a flow diagram illustrating generally the principal steps of an embodiment of the method illustrated in FIG. 4a-4f.

Basically, as illustrated by the flow diagram of FIG. 6, the method or process of one embodiment of the present invention may be generally stated as follows:

1) Providing a first electrically insulative substrate having one or more surface areas on a first side coated with a layer of conductive metal intended to form a ground plane or one or more ground plane conductors or regions;
2) Providing on a second side of the substrate a plurality of elongated seed layer traces having at least substantial portions thereof with a predetermined width (for example, of approximately 25 microns or less), adjacent ones of the seed layer traces being separated from each other by a predetermined distance of approximately 25 microns or less, the narrowness of such separation being essentially limited only by the characteristics of the photoresist material to be deposited and developed therebetween and its ability to withstand subsequent processing;
3) Photo-lithographically developing ribs or barriers of photoresist rising above the spaces separating the seed layer traces and having vertical side walls defining valleys or channels over the seed layer traces, the side walls having a height dimension in this case substantially exceeding the width of a seed layer trace;
4) Depositing conductive material over the seed layer traces and in the valleys or channels between the vertical walls to a desired thickness (depth H), in some cases substantially greater than the width of the channels and underlying seed layer traces;
5) Stripping away the resist ribs or barriers to leave conductive traces to be variously used as ground lines, signal lines and/or power lines of a circuit board;
6) Repeating the previous steps to develop a plurality of other similar circuit boards;
7) Stacking the several circuit boards and joining them together with layers of insulative material disposed therebetween;
8) Identifying particular ones of the conductive traces on various ones of the circuit boards as signal lines, and other conductive traces as power lines and/or ground lines;
9) Interconnecting at least some of the ground lines on one board to ground lines and/or ground planes on other boards by conductors extending through vias;

10) Interconnecting conductive traces (identified on one of the circuit boards as signal lines) to signal input and output terminals, and perhaps to other conductive traces identified as signal lines on other boards through vias; and 11) Interconnecting conductive traces identified on various ones of the circuit boards as power lines to power input and output terminals, and/or perhaps to conductive traces identified as power lines on other circuit boards through vias.

In an alternative embodiment, at least some of the signal lines may be separated by traces identified as ground lines which may have a cross-sectional configuration that is the same or different from that of the adjacent signal line traces.

In another alternative embodiment, substantially all of the signal lines on at least one of the circuit boards may be separated by ground lines.

In yet another alternative embodiment discussed below with respect to FIG. 11, a probe card device may be made by connecting contactor pins to at least some of the ground lines, the output terminals of at least some of the power lines, and the input or output terminals of at least some of the signal lines.

In FIGS. 7a-9, an alternative embodiment of the present invention is disclosed wherein instead of using an electroplating process to generate the conductive traces, a fluid injecting apparatus such as an ink jet printing device, or the like, is used to deposit conductive material in molten or fluid form into trace defining channels or valleys formed by ribs provided in a manner similar to that described above. In this embodiment, seed traces are not depicted because they are not believed to be necessary. However, such traces could be used in some circumstances to enhance the filling of the channels with conductive liquid.

Referring now to FIG. 7a, in forming a circuit board in accordance with the present invention, a planar starting substrate is shown generally at 110 having a particular dielectric constant suitable for the application described. Board 110 may be of a ceramic material, which is either a fired ceramic or an unfinished cold-fire ceramic, a woven epoxy glass material, such as that known as FR4, or any other suitable substrate material. The board preferably, but not necessarily, has a thin layer of metal, such as copper, plated on its bottom surface, as indicated at 111, to form a ground plane. Such ground plane need not be unitary or pre-attached to the substrate, and as is well known in the art, can be added as a separate layer covering one or more areas of the lower substrate surface during assembly of a device in accordance with the present invention.

Figure 7D:
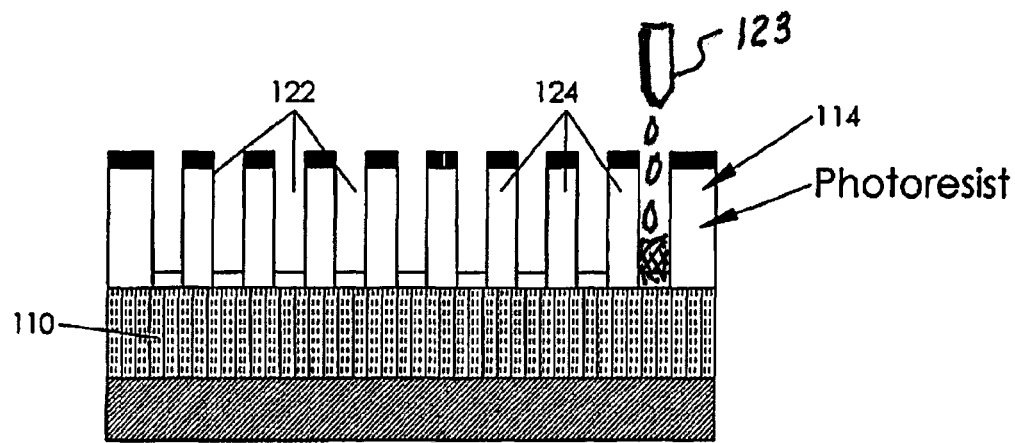
Figure 7E:
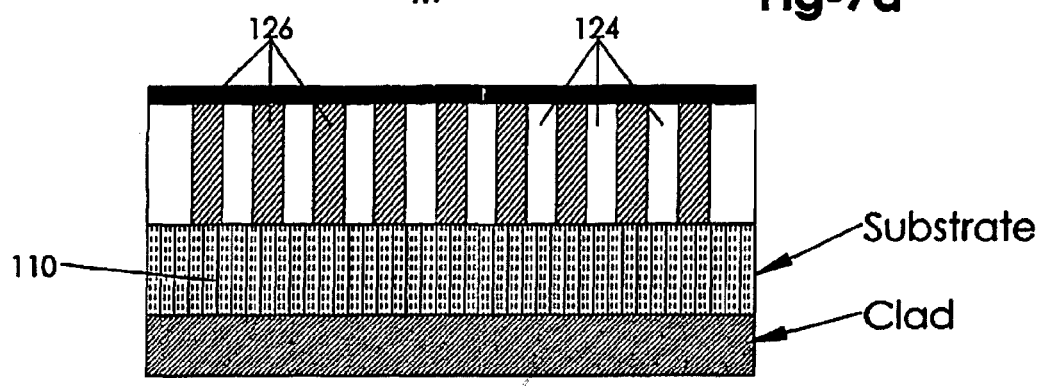

In this embodiment, wherein circuit traces are to be provided using an inkjet printing apparatus such as that manufactured by Imaging Technology International of Cambridge, England, and using a nano-silver ink such as that sold by Advanced Nano Products., Ltd. of Korea, no metallic seed layer is required. Accordingly, the first step, as illustrated in FIG. 7b, is to cover the surface of the layer 110 with a thick layer 114 of photoresist (typically between about 50 microns and 200 microns or more in thickness), and to use well known masking techniques, as suggested in FIG. 7c, to delineate a mask pattern above the resist having spaces or openings 116 between masked areas 118. The open areas 116 will allow photolithographic removal of the photoresist lying directly therebeneath to define channels or valleys 122 (as shown in transverse cross-section in FIG. 7d) separated and defined by ribs or barriers 124 of resist remaining beneath the masked areas. In accordance with the present invention, the transverse width of the channels 122 can be equal to or less than 25 microns and the widths of the ribs of resist 124 can likewise be equal to or less than 25 microns. And because of the thickness of the photoresist 114, the depth of the channels 122 can be on the order of about 25 to 200 microns or more.

Figure 7F:
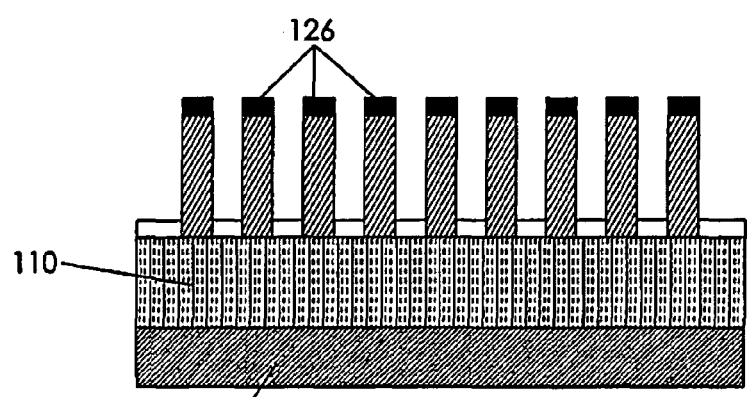

A predetermined thickness of a liquid metal can then be "printed" or deposited into the channels 122 between the photoresist ribs or barriers 124 using an ink jet printer or the like, as schematically shown at 123 in FIG. 7d, and after a suitable heat treatment to solidify or "cure" the liquid metal traces 126 (FIG. 7e), a suitable stripper may be used to strip away the ribs 124 to leave a circuit layer of well defined conductive traces 126 as depicted in FIG. 7f. Note that the spaces between the traces 126 can be left unfilled or can be back filled with a suitable liquid or particulate dielectric material. It will thus be appreciated that in using the method described above, and illustrated in FIGS. 7a-7e, a circuit layer of conductive traces can be formed on a dielectric substrate with the traces having a suitable predetermined cross-sectional area and being separated by as little as 25 microns or less. Note that the cross-sectional area of the traces can be of any desired width and height dimensions as required to satisfy a particular design criteria.

Currently, a desirable trace spacing is less than 20 microns. However, as pointed out above, no prior art printed circuit board making process is capable at this time of producing suitable, well defined circuit traces having trace widths of 25 microns or less separated by less than about 25 microns, and capable of handling sufficient electrical current (or having a suitable impedance characteristic) to be useful in multilayer circuit devices such as the transformer devices used in probe card systems and the like.

Figure 8:
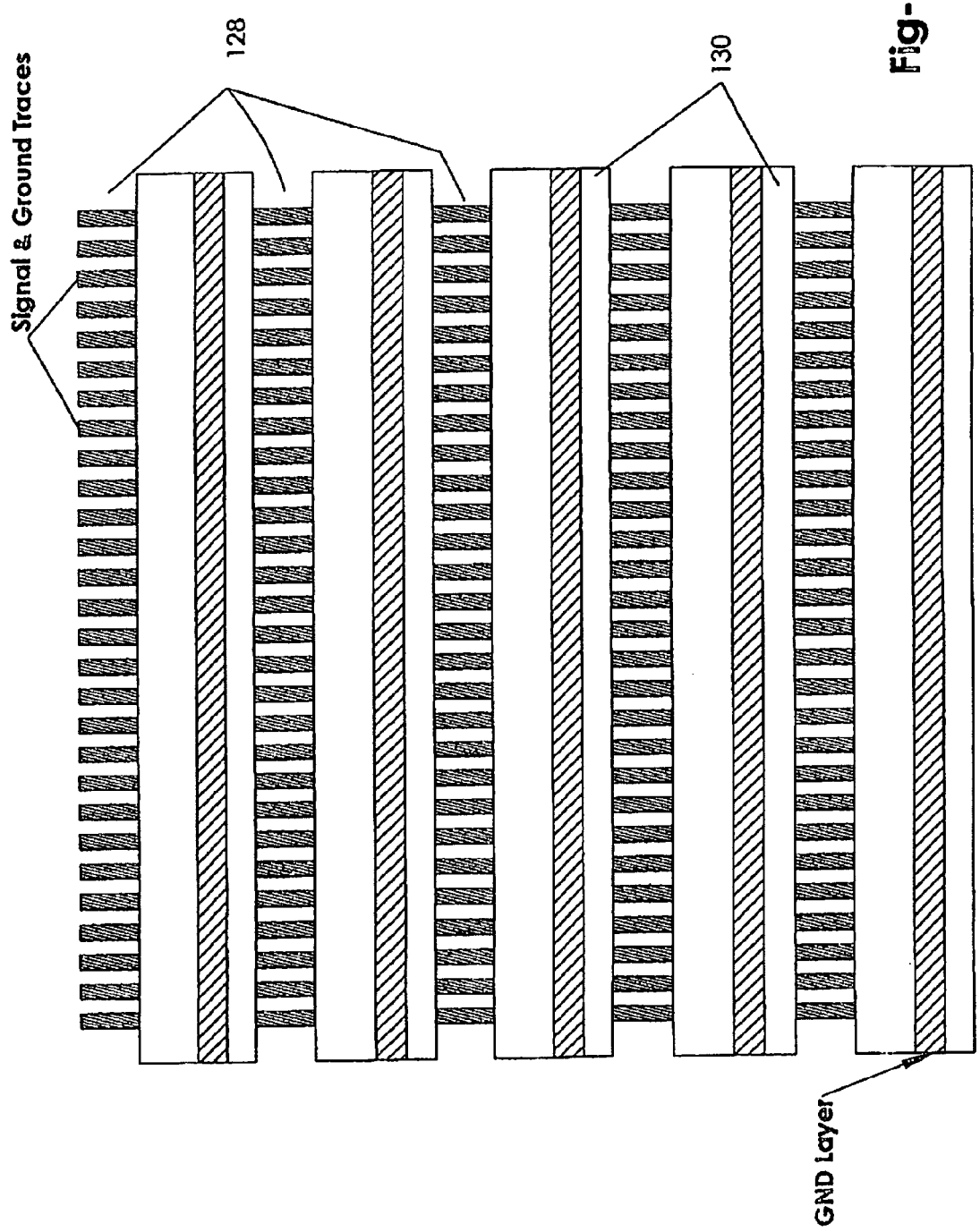
FIG. 8 shows an assembly including a plurality of layers of circuit board devices of the type depicted in FIG. 7f.
Figure 9:
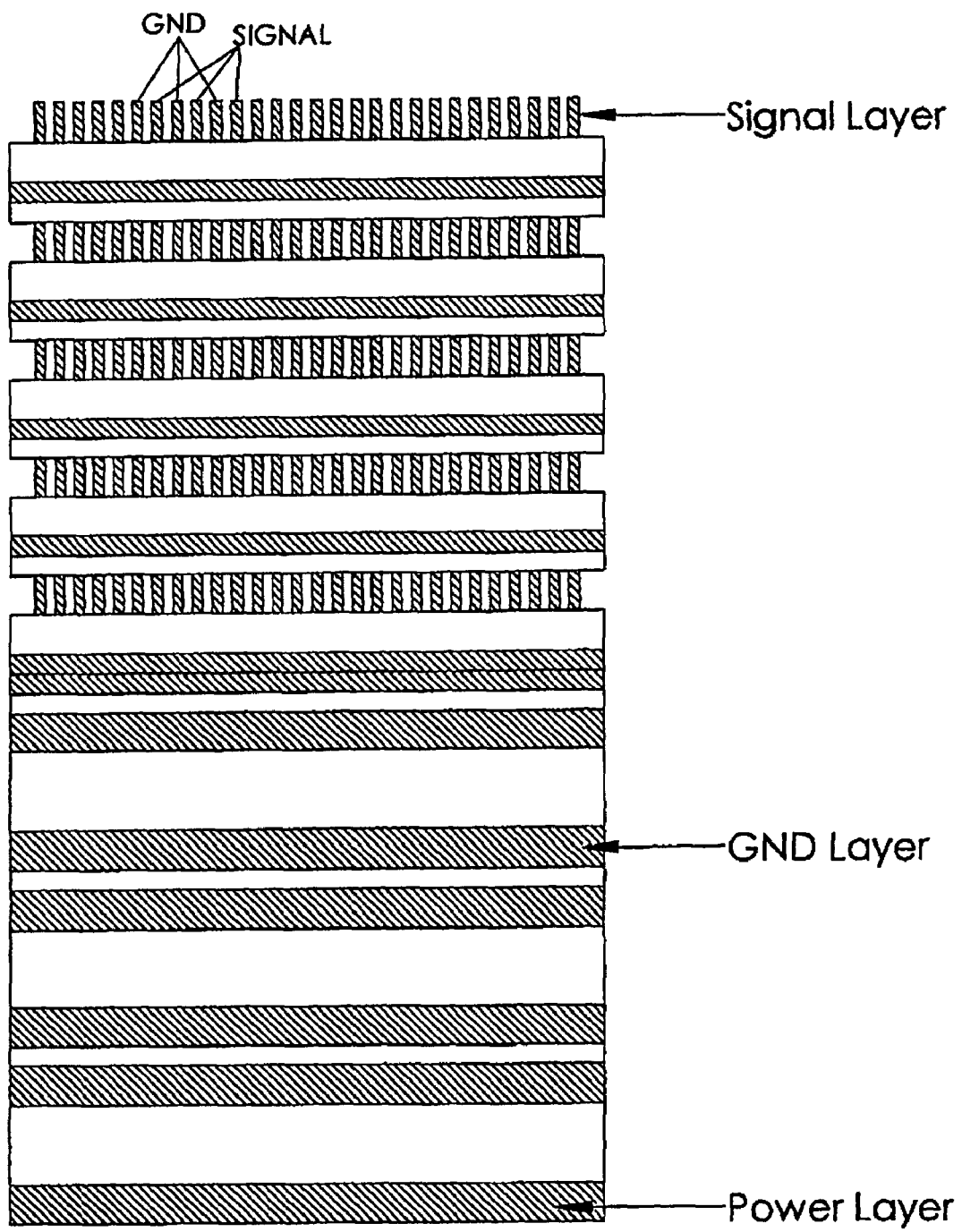
FIG. 9 shows a cross section of a circuit board device including an assembly as depicted in FIG. 8 and further including separate power and ground layers.
Figure 10:
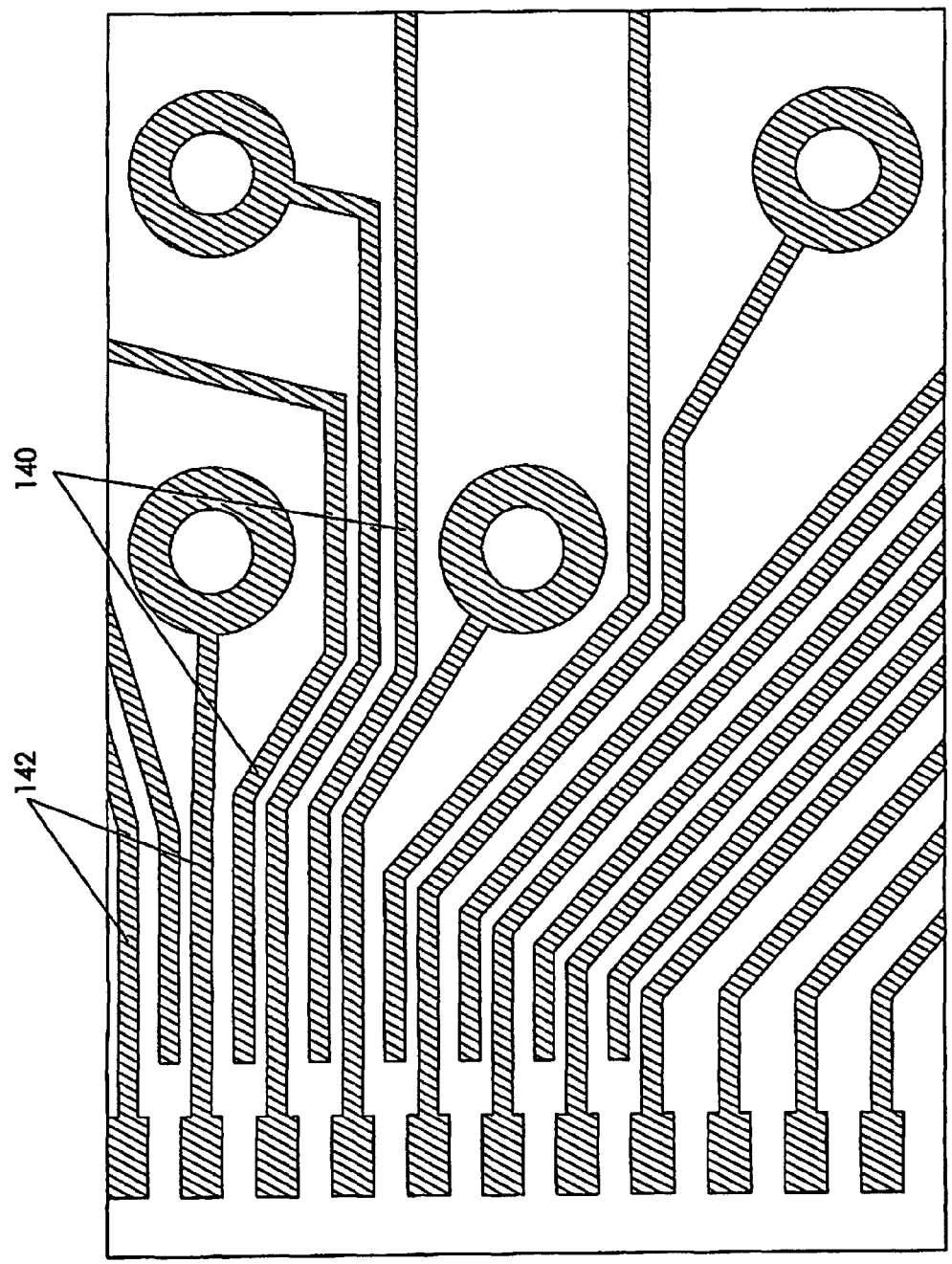
FIG. 10 shows a partial plan view of a circuit of the type formed in accordance with the present invention.

Once several circuit board layers or components are produced, they can be drilled to accommodate interconnecting vias (not shown), and stacked and joined together as depicted in FIGS. 8 and 9, by layers 130 of insulative bonding material such as Prepreg, Bondply, or layers of ceramic, or other dielectric material as well as epoxy or other suitable adhesive material. Alternatively, vias can be drilled or laser-formed after one or more of the circuit board layers are joined together.

This embodiment of the present invention may be stated generally as follows:

1) Providing an insulative substrate;
2) Developing ribs or barriers of photoresist forming circuit trace defining channels having vertical walls rising above the substrate surface upon which the circuit traces will be formed;
3) Depositing a desired thickness of liquid conductive material into the channels formed between the vertical walls;
4) Curing the deposited material and stripping away the resist ribs or barriers to leave conductive traces to be variously used as ground lines, signal lines and/or power lines;
5) Repeating the previous steps to develop a plurality of circuit boards;
6) Stacking the several circuit boards and joining them together with layers of insulative material;
7) Identifying particular ones of the traces as signal lines, and other traces as power lines and/or ground lines;
8) Interconnecting the ground lines on one board to ground lines and/or ground planes on other boards by conductors extending through vias;
9) Interconnecting signal lines to signal input and output terminals; and
10) Interconnecting the power lines to power input and output terminals, and perhaps to power lines on other boards through vias.

In another alternative embodiment, substantially all of the signal lines may be separated by a ground line.

Figure 11:
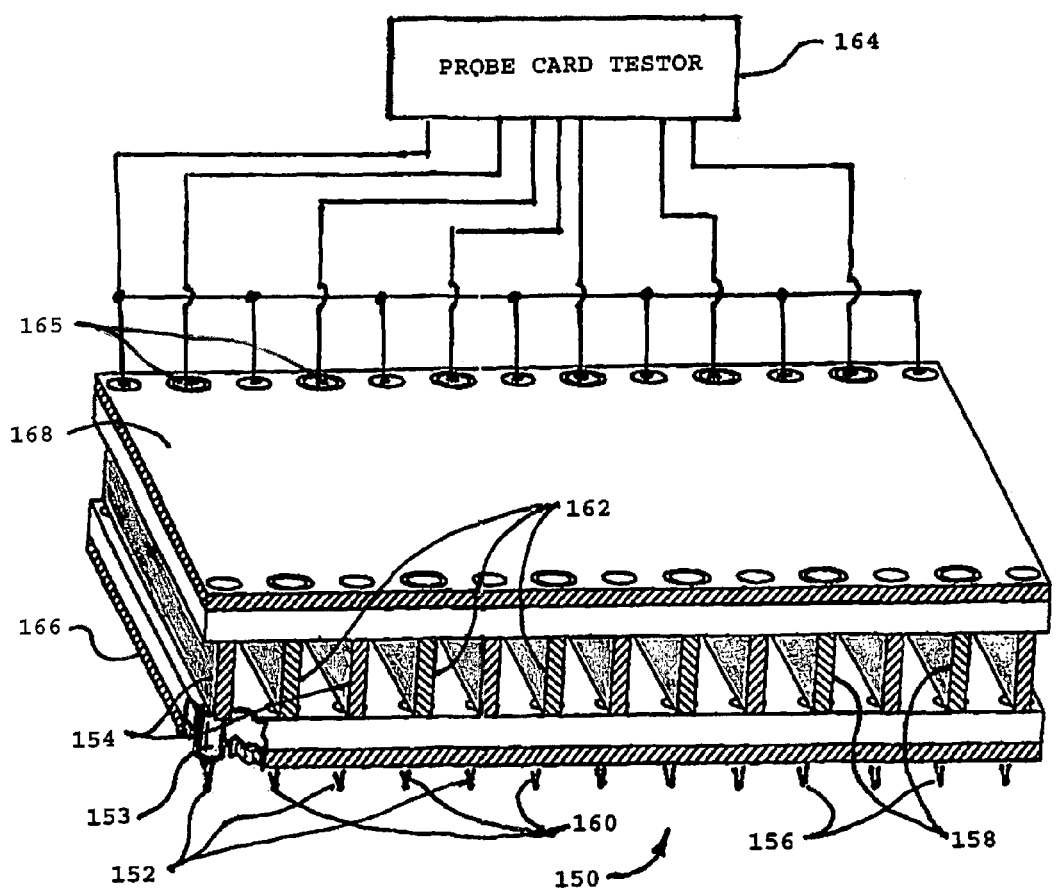
FIG. 11 is a simplified illustration of a probe card made using a circuit board of the type shown above.

In yet another alternative embodiment, and as suggested in simplified form by FIG. 11, a probe card device 150 including one or more circuit boards of the type described above (sometimes referred to as a transformer when used to provide converging interconnects from a relatively large test head interface to a very compact probe pin carrier) may be made by connecting contactor pins 152 (through lower layer vias) to the proximal ends of at least some of the ground line traces 154; by connecting contactor pins 156 to the proximal ends of power line traces 158; and by connecting contactor pins 160 to the proximal ends of some of the signal line traces 162. An appropriate test apparatus 164 connected to the opposite ends of the densely packed circuit traces by via conductors 165 insulatively passing through the ground plane 168 can then perform tests on semiconductor wafers engaged by the several contactor pins.

Note that as simplistically illustrated in FIG. 11, the alternating traces identified as "ground line traces 154," when ganged together and connected to a circuit ground such as the ground planes 166 and 168, functionally combine and interact with the signal lines 162 to in effect emulate coaxial conductors and achieve the impedance and noise reduction characteristics of such conductors.

The invention claimed is:

1. A multilayer circuit device comprising:
   a first insulative substrate having a first layer of conductive material affixed to a first side thereof to form a first ground plane;
   a plurality of elongated metallic first seed layer traces formed on a second side of the first substrate and having transverse widths of approximately 25 microns or less along at least a substantial portion of the length thereof, adjacent ones of said traces being separated from each other by first elongated spaces; and
   a plurality of elongated first conductive traces bonded to said first seed layer traces and having transverse widths of approximately 25 microns or less along at least substantial portions of the lengths thereof, said portions having a transverse cross section with a height-to-width ratio substantially equal to or exceeding 1, adjacent ones of said first conductive traces being separated from each other by second elongated spaces, at least some of said first conductive traces having opposite ends thereof respectively connected to input and output terminals and being variously useful as ground lines, signal lines and/or power lines.

2. A multilayer circuit device as recited in claim 1 and further comprising:
   a second insulative substrate disposed over said first conductive traces and having one side thereof affixed to said first conductive traces; and
   a second layer of conductive material affixed to the other side of said second insulative substrate to form a second ground plane.

3. A multilayer circuit device as recited in claim 2 wherein at least substantial portions of the lengths of said first elongated spaces between said substantial portions of the lengths of said first conductive traces have transverse widths of approximately 25 microns or less.

4. A multilayer circuit device as recited in claim 3 and further comprising:
   a third insulative substrate disposed over said second layer of conductive material and having one side thereof affixed thereto;
   a plurality of elongated metallic second seed layer traces formed over the opposite side of said third substrate with adjacent traces being separated from each other by second elongated spaces; and
   a plurality of elongated second conductive traces bonded to said second seed layer traces and having transverse widths of approximately 25 microns or less along at least substantial portions of the lengths thereof, said portions having a transverse cross section with a height-to-width ratio substantially equal to or exceeding 1, adjacent ones of said second conductive traces being separated from each other by third elongated spaces, at least some of said second conductive traces having opposite ends thereof respectively connected to input and output terminals.

5. A multilayer circuit device as recited in claim 2 wherein alternate ones of some of said first conductive traces form signal lines electrically connecting input and output terminals, and the conductive traces on both sides of said signal lines are connected to a circuit ground.

6. A multilayer circuit device as recited in claim 4 wherein at least some of said first conductive traces are electrically connected to some of said second conductive traces through vias extending through said second substrate and said second layer of conductive material.

7. A multilayer circuit device made by:
   providing a first substrate having conductive material affixed to a first side thereof to form a first ground plane;
   forming on a second side of said first substrate a plurality of elongated and parallel extending first ribs of photoresist forming first vertical walls rising above said second side of said first substrate to a height greater than 50 microns, the facing sides of said first walls being separated by less than 50 microns and defining open first channels on said second side of said first substrate;
   depositing an electrically conductive trace forming material into said first channels to a height above said second side of said second substrate exceeding the separation of said facing sides of said first walls; and
   stripping away said first ribs to leave a plurality of elongated first electrically conductive traces traces on said second side of said first substrate separated by first elongated spaces and having a transverse height-to-width ratio equal to or exceeding 1, said first conductive traces being variously useful as ground lines, signal lines and/or power lines.

8. A multilayer circuit device as recited in claim 7 wherein the transverse widths of said first ribs are equal to or less than approximately 50 microns.

9. A multilayer circuit device as recited in claim 7 and further comprising:
   disposing a second substrate over said first conductive traces; and
   disposing a second conductive material over said second substrate to form a second ground plane.

10. A multilayer circuit device as recited in claim 9 wherein alternate ones of said first conductive traces form signal lines electrically connecting input and output terminals, and the conductive traces on both sides of said signal lines form isolating lines connected to a circuit ground.

11. A multilayer circuit device as recited in claim 7 wherein said trace forming material is deposited as a conductive liquid and wherein the deposited liquid is cured by a heat treating operation to form said first conductive traces.

12. A multilayer circuit device as recited in claim 7 wherein said trace forming material is a conductive ink deposited by an ink jet printing device and wherein the deposited conductive ink is cured by a heat treating operation to form said first conductive traces.

13. A multilayer circuit device as recited in claim 12 wherein:
   a second substrate is disposed over said first conductive traces and one side is affixed thereto; and
   a second conductive material disposed on the opposite side of said second substrate forms a second ground plane.

14. A multilayer circuit device as recited in claim 13 wherein alternate ones of said first conductive traces form signal lines electrically connecting input and output terminals, and the conductive traces on both sides of said signal lines are connected to a circuit ground to form isolation lines.

15. A multilayer circuit device having electrically isolated tightly spaced electrical current carrying traces, comprising:
   a first nonconductive substrate having a first conductive material affixed to a first side thereof to form a first ground plane;
   a plurality of elongated first conductive traces formed on a second side of said first non-conductive substrate, said first conductive traces having transverse widths of 50 microns or less and rising above a second side of said first substrate to a height equal to or greater than the widths thereof such that said first conductive traces have a transverse height-to-width ratio equal to or exceeding 1, adjacent ones of said first traces being separated from each other by first elongated spaces, said first conductive traces being variously useful as ground lines, signal lines and/or power lines.

16. A multilayer circuit device as recited in claim 15 wherein said first elongated spaces have transverse widths of 50 microns or less.

17. A multilayer circuit device as recited in claim 15 and further comprising:
   a second non-conductive substrate disposed over said first conductive traces; and
   a second layer of conductive material formed over said second non-conductive substrate to form a second ground plane.

18. A multilayer circuit device as recited in claim 17 and further comprising:
   a third non-conductive substrate disposed over said second ground plane;
   a plurality of elongated second conductive traces formed on said third non-conductive substrate, said second conductive traces having transverse widths of 50 microns or less and rising above the upper surface of said second non-conductive substrate to a height equal to or greater than the widths thereof such that said second conductive traces have a transverse height-to width ratio equal to or exceeding 1.

19. A multilayer circuit device as recited in claim 18 and further comprising:
   a fourth non-conductive substrate disposed over said second conductive traces; and
   a third layer of conductive material formed over said fourth non-conductive substrate to form a third ground plane.

20. A multilayer circuit device as recited in claim 19 wherein at least some of said first conductive traces are electrically connected to some of said second conductive traces through vias extending through said second non-conductive substrate, said second ground plane and said third non-conductive substrate.

* * * * *